United States Patent
Hundemer et al.

(10) Patent No.: US 8,761,502 B1
(45) Date of Patent: Jun. 24, 2014

(54) SYSTEMS AND METHODS FOR IDENTIFYING A COLORBAR/NON-COLORBAR FRAME ATTRIBUTE

(71) Applicant: Tribune Broadcasting Company, LLC, Chicago, IL (US)

(72) Inventors: Hank J. Hundemer, Bellevue, KY (US); Dana A. Lasher, Morgan Hill, CA (US)

(73) Assignee: Tribune Broadcasting Company, LLC, Chicago, IL (US)

( * ) Notice: Subject to any disclaimer, the term of this patent is extended or adjusted under 35 U.S.C. 154(b) by 59 days.

(21) Appl. No.: 13/629,481

(22) Filed: Sep. 27, 2012

Related U.S. Application Data

(60) Provisional application No. 61/542,077, filed on Sep. 30, 2011, provisional application No. 61/542,103, filed on Sep. 30, 2011.

(51) Int. Cl.
*G06K 9/00* (2006.01)

(52) U.S. Cl.
USPC ........................................................ 382/165

(58) Field of Classification Search
USPC ............ 382/162, 164, 165, 181, 190; 345/88, 345/89, 208, 601; 348/229.1, 300, E5.119, 348/E9.027, E9.037
See application file for complete search history.

(56) References Cited

U.S. PATENT DOCUMENTS

| | | | |
|---|---|---|---|
| 5,302,946 A * | 4/1994 | Shapiro et al. | 345/88 |
| 5,339,387 A * | 8/1994 | Frankel | 345/601 |
| 6,195,458 B1 | 2/2001 | Warnick et al. | |
| 6,606,409 B2 | 8/2003 | Warnick et al. | |
| 6,721,361 B1 | 4/2004 | Covell et al. | |
| 6,724,933 B1 | 4/2004 | Lin et al. | |
| 6,778,224 B2 | 8/2004 | Dagtas et al. | |
| 6,801,179 B2 * | 10/2004 | Dalal | 345/89 |
| 8,355,059 B2 * | 1/2013 | Fukui | 348/229.1 |
| 8,441,565 B2 * | 5/2013 | Suzuki et al. | 348/300 |
| 2006/0026628 A1 | 2/2006 | Wan et al. | |
| 2009/0249386 A1 | 10/2009 | Shan et al. | |

\* cited by examiner

*Primary Examiner* — Amir Alavi

(74) *Attorney, Agent, or Firm* — McDonnell Boehnen Hulbert & Berghoff LLP

(57) ABSTRACT

Presently disclosed are systems and methods for identifying a colorbar/non-colorbar attribute of a current frame. One example embodiment takes the form of a method that includes (i) defining a region of a frame, the defined region having a plurality of lumas within a luma range; (ii) for each luma, calculating a luma percentage of the region; (iii) calculating a significant luma percentage counter based on the luma percentages and a threshold; (iv) calculating a significant luma percentage of the region, based on the luma percentages and the threshold; (v) determining a max-luma of the region; and (vi) identifying the current frame as having a colorbar attribute if (a) the significant luma percentage counter is within a significant luma percentage counter range, (b) the significant luma percentage is greater than a significant luma percentage threshold, and (c) the max-luma is greater than a fade luma threshold.

20 Claims, 6 Drawing Sheets

| LUMA VALUE | COUNT |
|---|---|
| 0 | 2 |
| 1 | 3 |
| 2 | 45 |
| 3 | 2 |
| ... | ... |
| 252 | 2 |
| 253 | 8 |
| 254 | 48 |
| 255 | 0 |

SYSTEMS AND METHODS FOR IDENTIFYING A COLORBAR/NON-COLORBAR FRAME ATTRIBUTE

CROSS REFERENCE TO RELATED APPLICATIONS

This application claims priority to U.S. Provisional Patent Application Ser. No. 61/542,077, entitled "System and Method for Automated Video Content Tagging," filed on Sep. 30, 2011 and U.S. Provisional Patent Application Ser. No. 61/542,103, entitled "System and Method for a Master Controller," filed on Sep. 30, 2011, both of which are hereby incorporated by reference herein in their entirety.

This application also relates to U.S. patent application Ser. No. 13/629,405, entitled "Systems and Methods for Identifying a Black/Non-Black Frame Attribute," U.S. patent application Ser. No. 13/629,495 entitled "Systems and Methods for Identifying a Video Aspect-Ratio Frame Attribute," U.S. patent application Ser. No. 13/629,446, entitled "Systems and Methods for Identifying a Scene Change/Non-Scene-Change Transition Between Frames," U.S. patent application Ser. No. 13/629,430, entitled "Systems and Methods for Identifying a Mute/Sound Frame Attribute," and U.S. patent application Ser. No. 13/629,497, entitled "Systems and Methods for Electronically Tagging a Video Component in a Video Package," all of which are commonly assigned to the assignee of the present application, are being filed simultaneously, and are hereby incorporated by reference herein in their entirety.

USAGE AND TERMINOLOGY

Throughout this application, with respect to all reasonable derivatives of such terms, and unless otherwise specified (and/or unless the particular context clearly dictates otherwise), each usage of:

"a" or "an" is meant to read as "at least one."

"the" is meant to be read as "the at least one."

the term "video" refers broadly to any material represented in a video format (i.e., having a plurality of frames). In some instances, video may include a plurality of sequential frames that are identical or nearly identical, and that may give the impression of a "still" image. Video may also include frames that merely show a black screen, colorbars, testing data, or other traditionally non-substantive content. It should be noted that while non-substantive content may have little or no utility to a typical viewer, it provides useful information for the purpose of the techniques described throughout this disclosure. Video may or may not include an audio portion.

the term "video component" (VC) refers to video that one of ordinary skill in the art would typically consider to be self-contained, and that is typically separately scheduled by a scheduling-and-sequencing system (also commonly referred to as a traffic system) in a broadcasting environment. There are several types of VCs, including for example a show-segment VC, a barter VC, and a promotion VC. A show-segment VC consists of at least a portion of a show, and potentially one or more commercials, all of which are grouped together and considered as one unit for the purpose of scheduling-and-sequencing. A show may be, for example, an episode of a sitcom, a news program, or a movie. A barter VC consists of one or more commercials, all of which are grouped together and considered as one unit for the purpose of scheduling-and-sequencing. A barter VC is a subset of a show-segment VC, namely the portion including the one or more commercials. A promotion VC consists of a promotion or advertisement (e.g., for an associated show).

the term "video package" refers to a collection of VCs and other video, all of which has a logical or other relationship or association. Typically, the video package includes a plurality of sequentially ordered VCs that are separated by other video (e.g., black frames), although the video package may have the technical appearance of being a single, continuous piece of video when analyzed using traditional methods. Each video package includes at least one, and often a group of show-segment VCs that are intended to be aired during a corresponding thirty-minute, one-hour, two-hour, or other predefined time slot. Though not required, a video package is often created by a show syndicator and provided to a broadcaster.

TECHNICAL FIELD

The presently disclosed systems and methods relate to video analysis and, more particularly, to systems and methods for identifying a colorbar/non-colorbar frame attribute.

BACKGROUND

Video technology relates to electronically capturing, processing, recording, and reconstructing a sequence of still images referred to as frames, so as to represent motion. Video includes a number of frames based on a predefined frame rate. For example, in the U.S., the Advanced Television Systems Committee ("ATSC") establishes a standard frame rate of 29.97 frames/second for video used for commercial broadcasting.

For video transmitted via a digital video signal (e.g., based on the high definition serial digital interface (HD-SDI) standard), each frame is represented by a number of pixels commonly described as the smallest unit of an image that can be represented or controlled. The number of pixels in a frame is based on a predefined resolution of the frame (typically defined by a number of columns and rows of pixels). For example, a frame having a resolution of 1920 columns and 1080 rows is referred to as 1920×1080 and is represented by the arithmetic product of approximately 2,073,600 pixels. Pixels have many attributes, including for example, chrominance values that represent color, and luma values (referred to herein as lumas) that represent brightness. Once captured and processed, video is typically encoded and recorded as a digital file. Thereafter, the file is retrieved and the video is reconstructed by decoding the file.

For a variety of reasons, such as to assist with video editing, it is generally considered useful and helpful to analyze video frames and identify select types of frames. One such type is a colorbar frame, which is one that displays a static arrangement of colored bars. These bars are commonly referred to as Society of Motion Picture and Television Engineers ("SMPTE") colorbars and are used as a type of television test pattern.

An example of a colorbar frame is shown in FIG. 1, and generally designated 100. The colorbar frame 100 includes three rows of bars. A first row 102 has seven relatively tall bars, each having a chrominance value representing a color. In order from left to right, the bars are generally light gray, yellow, cyan, green, magenta, red, and blue. These bars represent all seven possible color combinations that use at least one of the three chrominance value components of red, green, and blue, with blue cycling on and off between every bar, red cycling on and off between every two bars, and green cycling on for the leftmost four bars and off for the rightmost three bars.

In the colorbar frame 100, a second row has seven relatively short bars, again each having a chrominance value representing a color. In order from left to right, the bars are generally blue, black, magenta, black, cyan, black, and light gray. Finally, a third row 106 has eight relatively medium height bars (having various widths), again with each having a chrominance value representing a color. In order from left to right, the bars are generally dark blue, white, purple, black, black, dark gray, gray, and black.

While one example of a colorbar frame has been discussed, there are several variations of colorbar frames. For example, some colorbar frames may include only a first row, wherein the tall bars extend the entire height of the frame. Other colorbar frames may include variations in the positions and counts of rows or bars, and/or may include variations in the specific colors of the bars, and certainly other variations and examples are possible. The vast majority of colorbar frames, however, contain certain common characteristics; for example, each bar is a generally uniform color.

SUMMARY

Disclosed herein are systems and methods for identifying a colorbar/non-colorbar frame attribute, such systems and methods providing several advantages.

One example advantage of the presently disclosed systems and methods is the ability to identify a colorbar/non-colorbar frame attribute while minimizing or eliminating false-positive and false-negative results.

Another example advantage of the presently disclosed systems and methods is the ability to identify a colorbar/non-colorbar frame attribute while minimizing the use of system resources.

Another example advantage of the presently disclosed systems and methods is the ability to identify a colorbar/non-colorbar frame attribute for a plurality of frames of video while contemporaneously processing each frame to create an encoded file, and wherein corresponding steps for each frame are performed during an execution time period that is less than a reciprocal of a frame rate of the video.

Various embodiments of the presently disclosed systems and methods may have none, some, or all of these advantages. Other advantages will be readily apparent to one of ordinary skill in the art.

A first example embodiment takes the form of a non-transitory computer-readable medium containing instructions that, when executed by a processor, cause a set of steps to be carried out for identifying a colorbar/non-colorbar attribute of a current frame. The set includes (i) receiving the current frame; (ii) defining a region of the current frame, the defined region having a plurality of lumas within a luma range; (iii) for each luma in the luma range, calculating a luma percentage of the region; (iv) calculating a significant luma percentage counter based on the luma percentages and a qualifying luma percentage threshold; (v) calculating a significant luma percentage of the region, based on the luma percentages and the qualifying luma percentage threshold; (vi) determining a max-luma of the region based on the lumas; (vii) identifying the current frame as having a colorbar attribute responsive to every condition in a condition set being satisfied, the condition set including at least first, second, and third conditions, the first condition being that the significant luma percentage counter is within a significant luma percentage counter range, the second condition being that the significant luma percentage is greater than a significant luma percentage threshold, and the third condition being that the max-luma is greater than a fade luma threshold, and (viii) storing an indication of an associated colorbar/non-colorbar frame attribute in a memory.

A second example embodiment takes the form of a frame-processing device that includes a processor and the non-transitory computer-readable medium described in the preceding paragraph.

A third example embodiment takes the form of the method described two paragraphs above this one, where the current frame is received from a source device.

BRIEF DESCRIPTION OF THE DRAWINGS

For a more complete understanding of the presently disclosed systems and methods, reference is now made to the following descriptions, taken in conjunction with the accompanying drawings, in which.

DETAILED DESCRIPTION OF THE DRAWINGS

Figure 1:
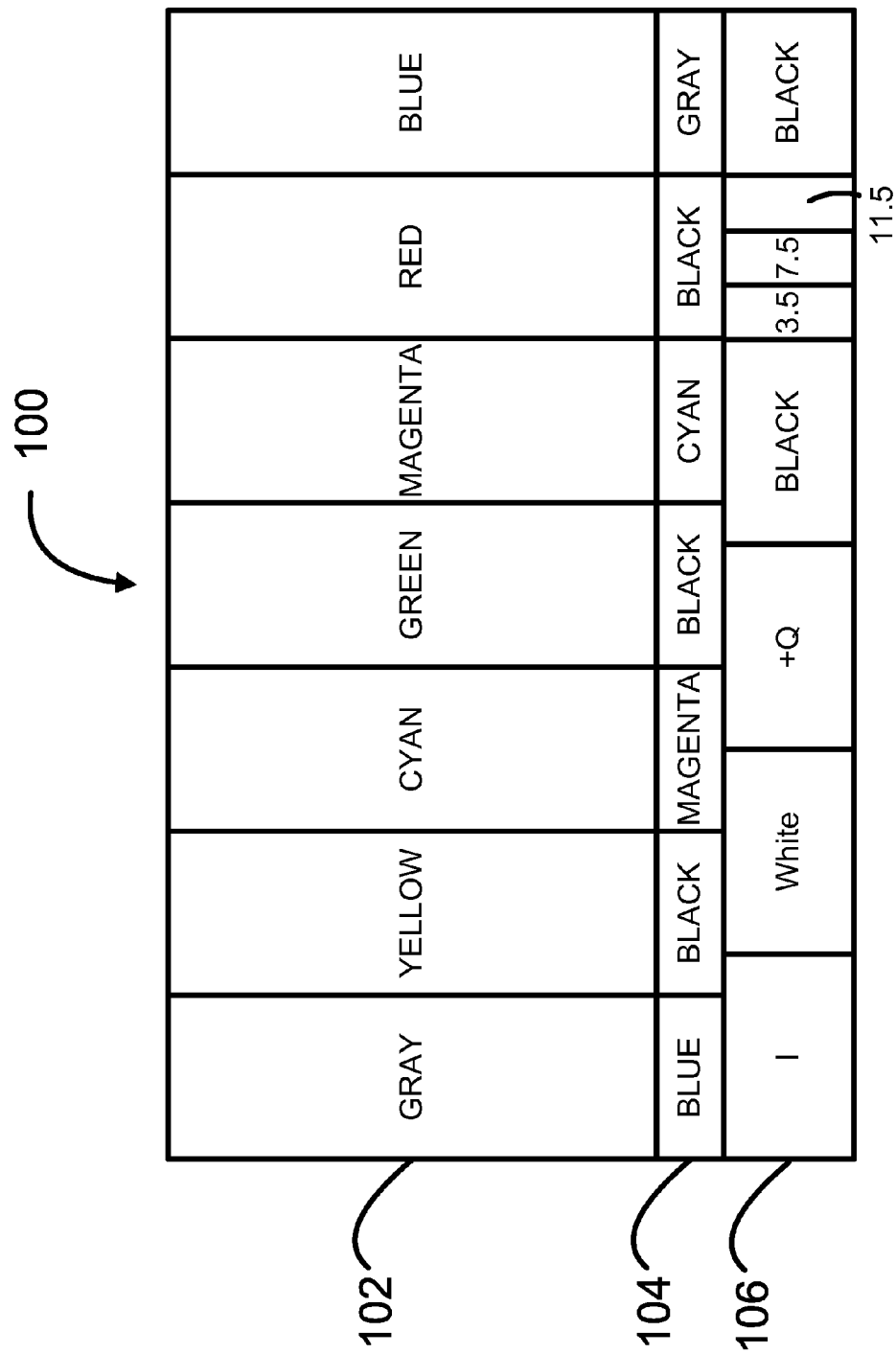
FIG. 1 is an example of a colorbar frame as known in the prior art.
Figure 2:
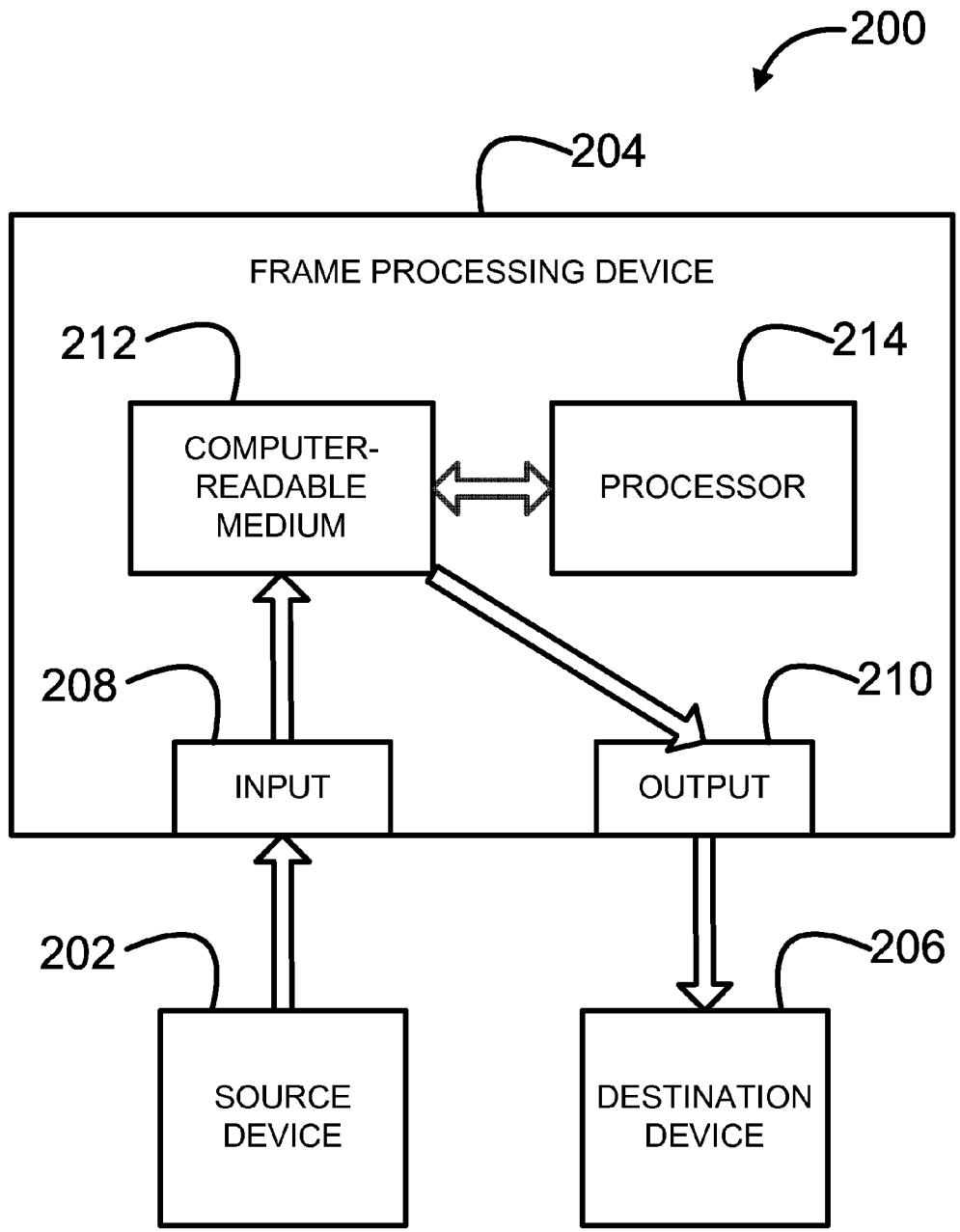
FIG. 2 is an example of a system in accordance with at least one embodiment.

Turning now to FIG. 2, an example system is provided and is generally designated 200. Included in the system 200 are a source device 202, a frame-processing device 204, and a destination device 206. Example source devices 202 include satellite receivers, decoders, baseband fiber transcoders, DVD players, Internet-delivery-based playout devices (e.g., Pathfire devices provided by DG FastChannel, Inc. of Irving Tex.), and other frame-processing devices.

The frame-processing device 104 includes a video input connection 208 and is configured for receiving video via the video input connection 208 from the source device 202. In at least one embodiment, the frame-processing device 204 is configured for receiving raw baseband video based on the HD-SDI standard with a data transfer rate in the range of 1.4 Gbps-1.6 Gbps (and typically approximately 1.485 Gbps). Throughout this application, unless otherwise stated, all disclosed ranges are inclusive of the stated bound values. It is contemplated that the frame-processing device 204 is optionally configured for receiving video based on other standards including but not limited to those defined by the SMPTE as well as those of the ATSC.

A video output connection 210 on the frame-processing device 204 is configured for sending video to a destination device 206 (for, e.g., playout of the video), which may include one or more of the example source devices 202 listed above. Further, the frame-processing device 204 includes a non-transitory computer-readable medium 212 and a processor 214. The video input connection 208, the video output connection 210, the computer-readable medium 212, and the processor 214 are all directly or indirectly electronically connected. Moreover, the frame-processing device 204, the source device 202, and the destination device 206 are all directly or indirectly electronically connected (in one embodiment via the video input connection 208 and the video output connection 210).

Figure 3A:
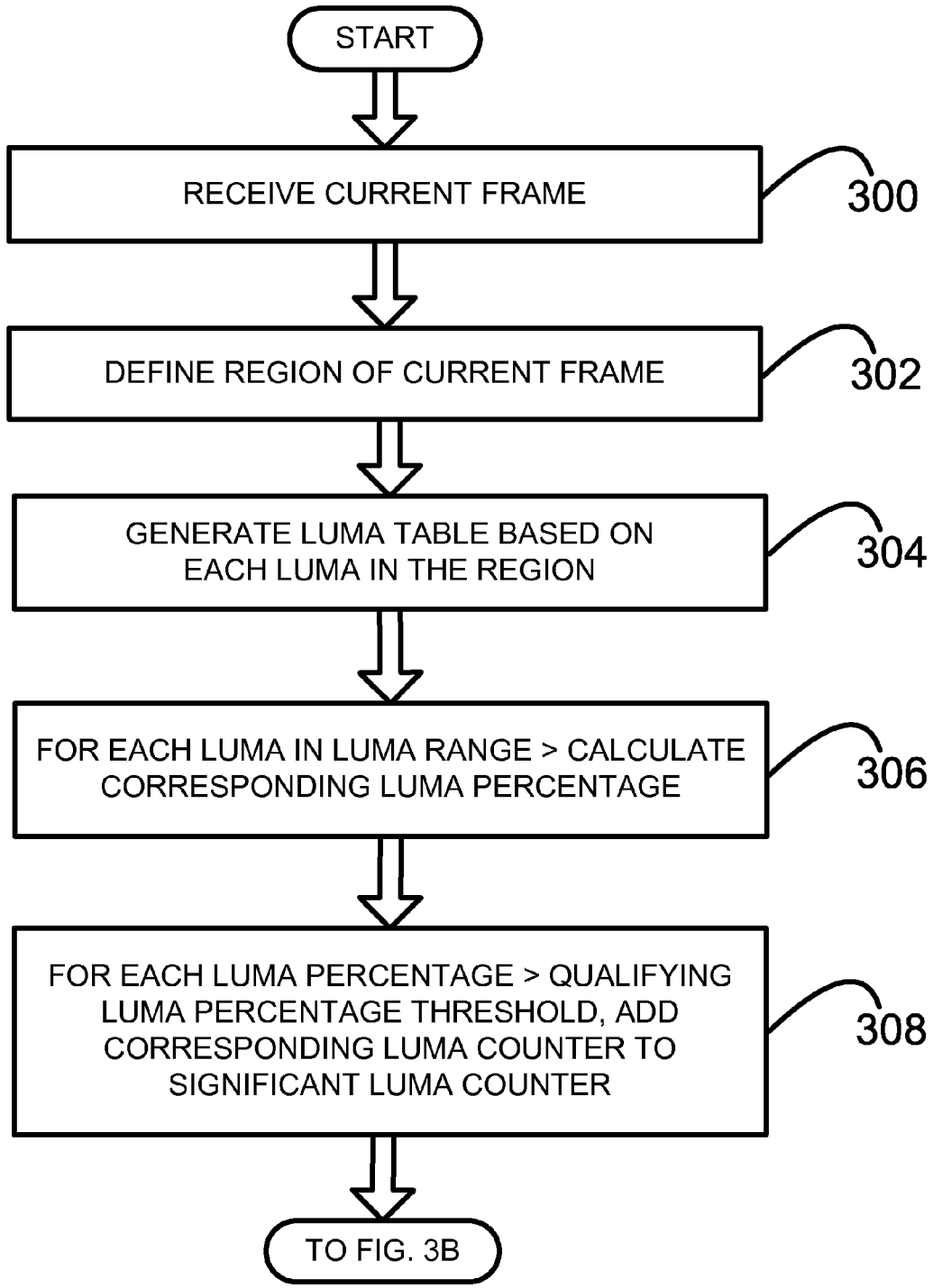
FIG. 3A is a first part of a flow chart illustrating an example of a method in accordance with at least one embodiment.
Figure 3B:
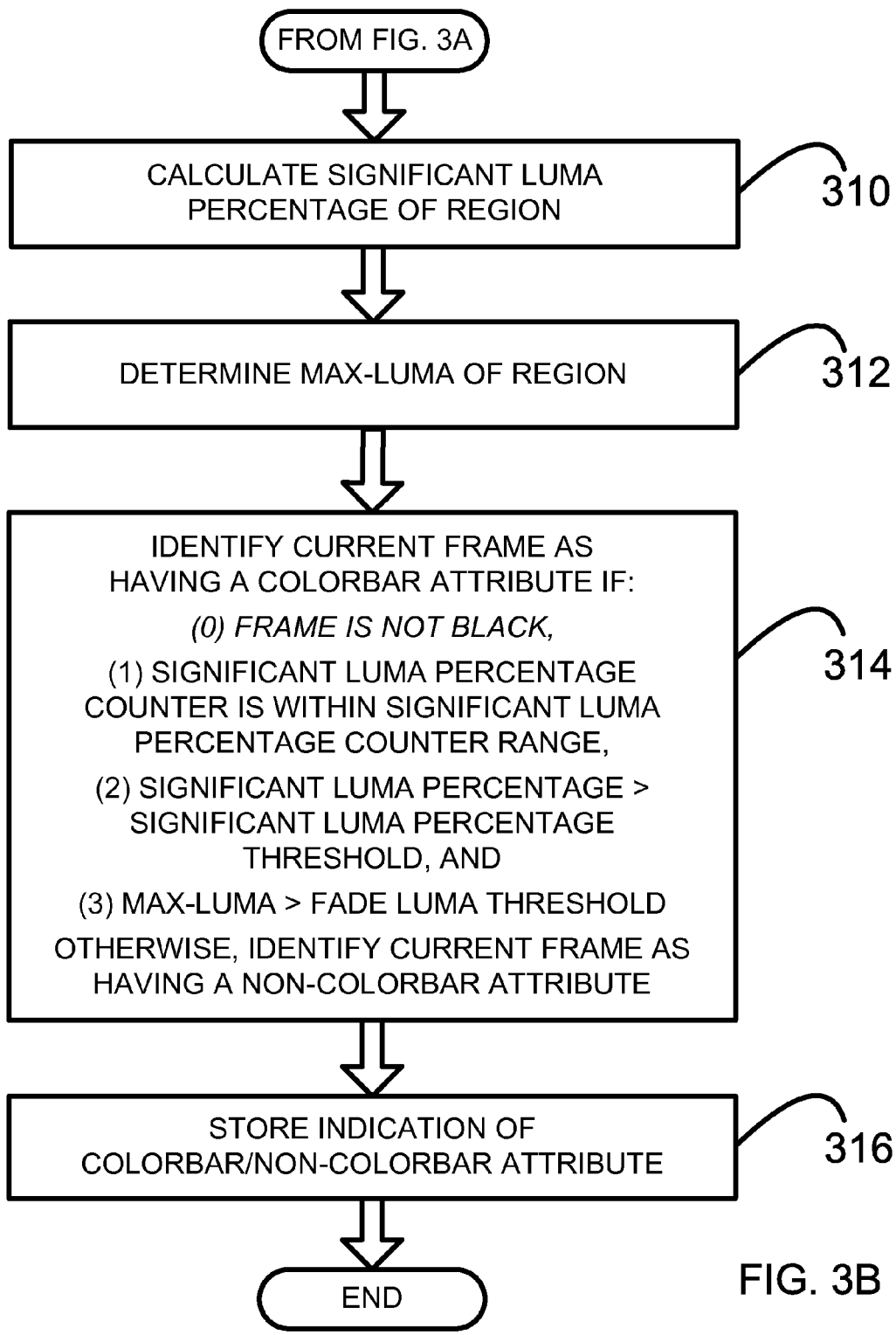
FIG. 3B is a second part of the flow chart of FIG. 3A.

The computer-readable medium 212 contains instructions that, when executed by the processor 214, cause a set of steps to be carried out for identifying a colorbar/non-colorbar attribute of a frame. Turning now to FIGS. 3A and 3B, a flow chart illustrating the set of steps, and an example of the present method embodiment, is shown. It is noted that, here and throughout this application, the described steps need not be performed in the disclosed order, although in some embodiments an order is preferred. Also, not all steps need to be performed to achieve the various advantages of the present systems and methods, and therefore not all steps are required.

As discussed, video includes a plurality of frames, and in at least one embodiment the present method is applied to each received frame. However, for clarity, the present method is described herein with reference to a "current" frame of the video being received from the source device 202 (e.g., as the source device plays out the video) by the frame-processing device 204 (via the video input connection 208).

At step 300, a current frame of the video is received. As discussed above, a frame is represented as a plurality of pixels, with each pixel having a luma representing a level of brightness within a luma range. Unlike traditional approaches where chrominance values may be considered, the present systems and methods analyze lumas to identify a colorbar/non-colorbar frame attribute. Such an approach reduces the use of system resources as compared to, for example, the high processing power required to analyze chrominance values.

In some embodiments, the luma range may be defined by the video format. For example, 8-bit video may define a luma range of 0-255, while 10-bit video may define a luma range of 0-1023. However, in some instances, it may be desired to modify the defined luma range, such as to exclude so-called super-white and super-black levels that typically are not captured when the video is recorded. For example, for 10-bit video, a narrowed luma range of 64-940 may be used. In some embodiments, it may be desired to modify the defined luma range by using bit-shifting techniques. For example, by performing two right bit-shifts on the 10-bit video luma range of 0-1023, the luma range is reduced to 0-255. Among other things, this may allow for more efficient processing for calculations that involve luma values. For the described embodiments, this bit shifted luma range of 0-255 will be referenced (with 0 representing no brightness, i.e., completely black, and 255 representing full brightness, i.e., completely white), but as described above, different ranges are also contemplated and can be used.

Figure 4:
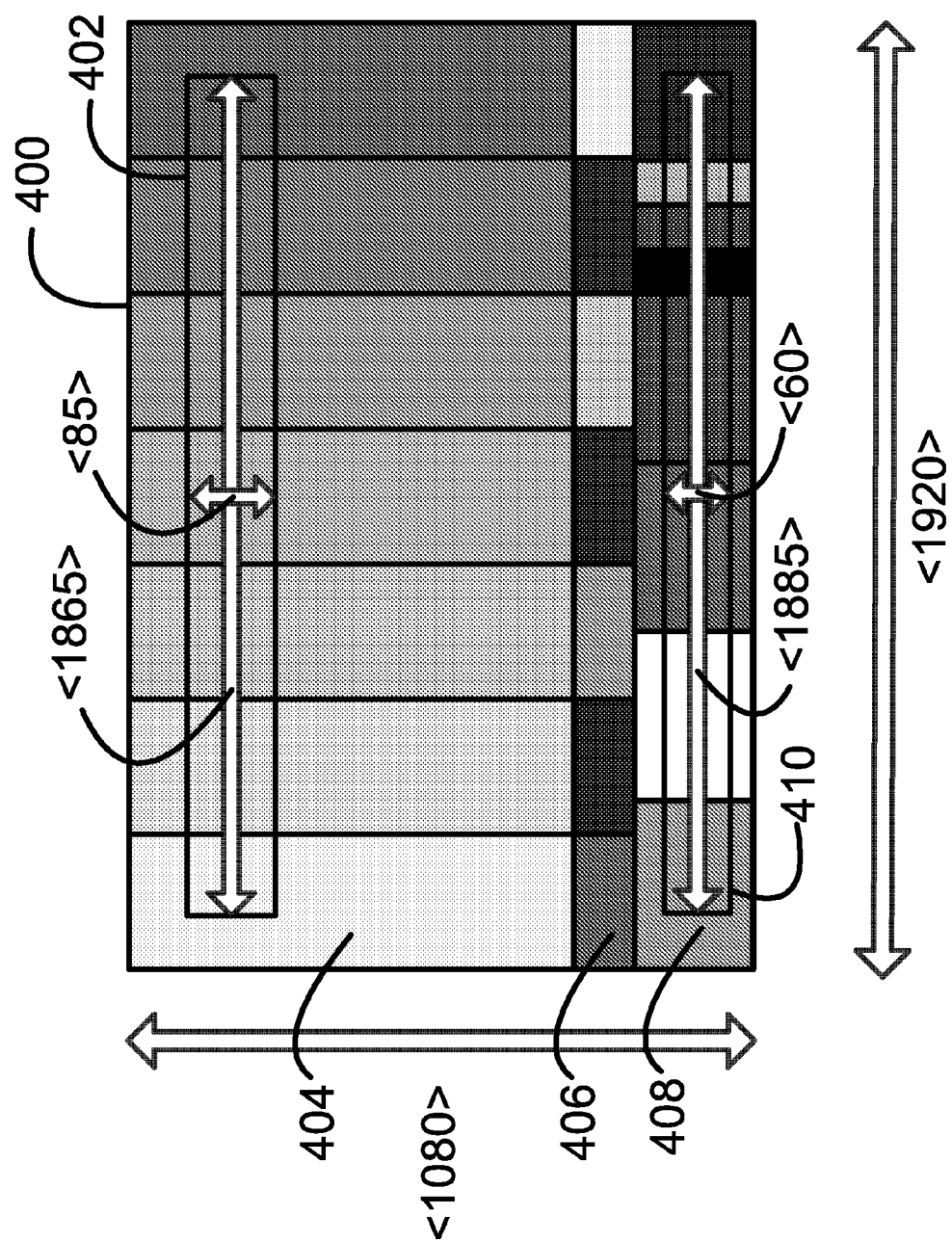
FIG. 4 depicts an example of a frame, a first region, and a second region in accordance with at least one embodiment.

At step 302, a region of the current frame is defined. An example of a current frame 400 and a corresponding region 402 are shown in FIG. 4 (not drawn strictly to scale). While the region 402 optionally includes the entire current frame 400, the region can define a lesser portion of the current frame. In one embodiment, the region 402 is a generally rectangular-shaped portion of the current frame 400 and is defined by a left-bound column, a right-bound column, a top-bound row, and a bottom-bound row. For a current frame 400 having a resolution of approximately 1920×1080, in one embodiment, the left-bound column is a value in a range 10-50, the right-bound column is a value in a range 1870-1910, the top-bound row is a value in a range 10-40, and the bottom-bound row is a value in a range 50-250. In a particular embodiment, the values are 15, 1880, 15, and 100, respectively (thereby defining a region having a resolution of approximately 1865×85).

For frames having alternative resolutions, the bound ranges and values may be modified as desired and/or appropriate. In some embodiments, such modification may include scaling (e.g., proportionally) the ranges and/or values. In other embodiments, it may be desired to increase the size of the region, while generally maintaining the proximity of the borders of the region to the borders of the frame (since this is where static and noise typically occurs). Indeed, the specific size and shape of the region may vary to suit the application.

Since the current frame 400 includes lumas associated with each pixel, the corresponding region 402 defines a set of lumas that are used to generate a luma table. Use of the region 402 helps to filter out portions of the current frame 400 that are likely to be affected by static or noise, and also reduces the use of system resources as fewer lumas are analyzed. Notably, static or noise often occurs near the edges, and particularly the left and right edges, of a frame (as a result of, e.g., clock heterodyne artifacts resulting from old transmission methods).

Figures 5, 6:
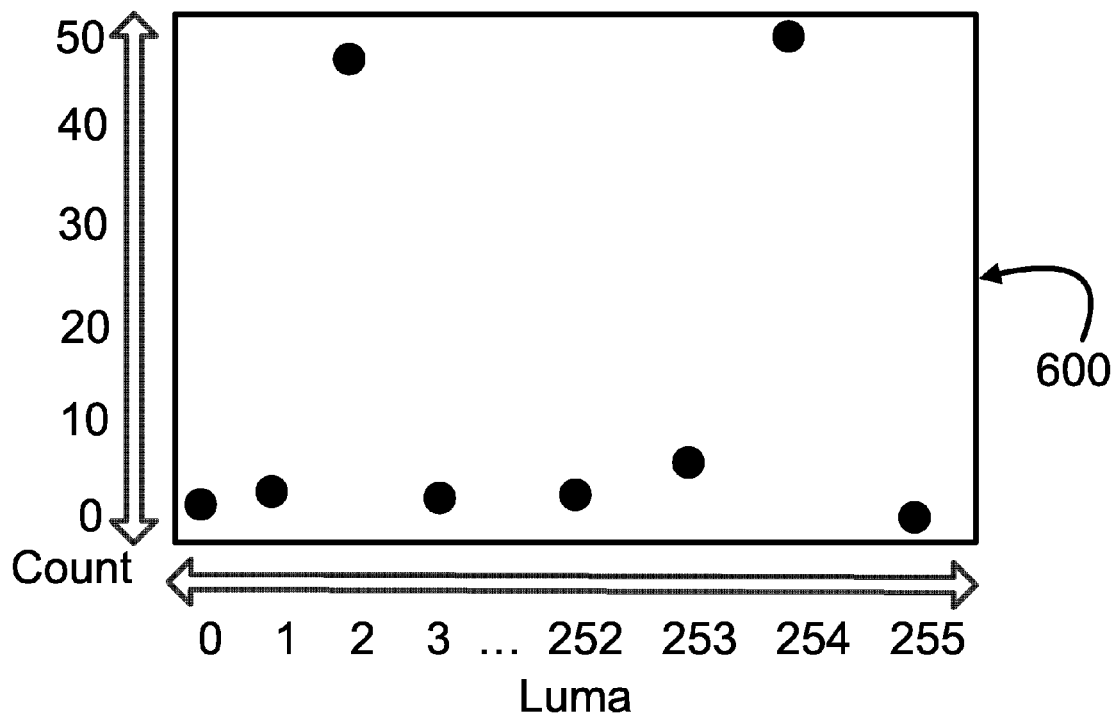
FIG. 5 depicts an example of a luma table in accordance with at least one embodiment.
FIG. 6 depicts an example of a graphical representation of the luma table in FIG. 5.

At step 304, a luma table is generated, where the luma table has a luma counter for each luma in the luma range based on the lumas in the region 402. An example luma table 500 and a corresponding graphical representation 600 for the current frame 400 are shown in FIGS. 5 and 6, respectively. To promote efficiency, in at least one embodiment the luma table 500 is stored in a register memory (e.g., cache) included on the processor 214. Such a configuration greatly improves the speed at which values in the luma table 500 are retrieved, thereby increasing the execution speed of the present method.

At step 306, for each luma in the luma range, a corresponding luma percentage of the region 402 is calculated. In one embodiment, each luma percentage is calculated by dividing the corresponding luma (identified in the luma table 500) by a total luma count for the region 402. Notably, while the above-described calculations are used in one embodiment, they need not be performed based on the described strict calculations (i.e., calculating the identified percentages may be achieved using alternate functions). Further, as used herein the term "percentage" is not limited to a number represented as a fraction of one hundred, but instead refers to any expression of a quantity relative to another quantity, and may include for example, a ratio.

Select luma percentages are identified as "significant luma percentages" if they exceed a qualifying luma percentage threshold, which in one embodiment is a value in a range 3.0%-7.0%, and in a particular embodiment is approximately 5.0%. These significant luma percentages are used to assist in identifying bars in the colorbar frame (since they typically have a generally uniform luma). For example, as shown in FIG. 6, the spikes for luma 2 and luma 254 are deemed significant and likely represent a particular bar in the region 402. Using this analysis, it can be determined—among other properties—how many bars are contained in the region 402, and what percentage of that region 402 is occupied by those bars.

A "significant luma counter" is initialized (e.g., set to 0), and at step 308, for each luma percentage greater than the qualifying luma percentage threshold, a corresponding luma counter (identified in the luma table 500) is added to the significant luma counter. The significant luma counter therefore effectively represents an approximate count of colorbars in the region 402. Further, at step 310, a significant luma percentage of the region 402 is calculated (by, e.g., combining each of the significant luma percentages), where this value thus effectively represents the approximate total percentage of the region 402 that is occupied by colorbars. At step 312, a max-luma of the region 402 is determined based on the lumas in the region.

At step 314, the current frame 400 is identified as having a colorbar attribute responsive to every condition in a condition set being satisfied. One condition—referred to here as a pre-condition, and noted as such using the number "(0)" and italic lettering—that can optionally first be tested is that the frame is not "black" (e.g., that the frame has a non-black attribute). Such a determination can be made using at least one technique described in the cross-referenced U.S. patent application Ser. No. 13/629,405, however other techniques known to those of ordinary skill in the art can also be employed. By testing this pre-condition, frames can be dropped from consideration if they are known to be black, and therefore, could not and would not be colorbar frames.

The first condition is that the significant luma percentage counter is within a significant luma percentage counter range, which in one embodiment has a lower bound value in a range 2-4, and in a particular embodiment is 3, and which in one embodiment has an upper bound value in a range 12-14, and in a particular embodiment is 13. This first condition ensures that the frame includes a sufficient count of colored bars in the current frame 400, and more particularly within the region 402, which in one embodiment is defined specifically to identify the relatively long bars in the first row 404 of the region.

The second condition is that the significant luma percentage is greater than a significant luma percentage threshold, which in one embodiment is a value in a range 70%-80%, and in a particular embodiment is approximately 75%. This condition assists in avoiding potential false-positive results that may be provided when a frame contains several distinct colored portions but is not actually a colorbar frame. For example, a frame showing several pieces of brightly colored candy on a table may satisfy the pre-condition and the first condition, but of course is not intended to be identified as having a colorbar attribute. By testing this second condition, the remaining portions of the frame (which, for substantive frames, typically contain a large and scattered sample of lumas), are not likely to be deemed "significant," and therefore the significant luma percentage is not likely to exceed the significant luma percentage threshold. Accordingly, the frame is properly not identified as having a colorbar frame attribute.

Finally, the third condition is that the max-luma is greater than a fade luma threshold. For a current frame 400 having a resolution of approximately 1920×1080, in one embodiment the fade luma threshold is a value in a range 118-138, and in a particular embodiment is 128. For frames having alternative luma ranges, the fade luma threshold may be scaled (e.g., proportionally) accordingly. This third condition specifically addresses issues presented when a frame is part of a series of transition frames representing a "fade out" (between, e.g., scenes of a movie). When a fade out occurs over a series of transition frames, typically the brightness is reduced first (i.e., the lumas are decreased), followed by the chrominance values progressing towards black. When the lumas are decreased enough in such transition frames, select frames may satisfy the pre-condition and each of the first two conditions. However, by testing this third condition to ensure (based on the max-luma) that the frame has a sufficient level of brightness, such transition frames are properly identified as not having a colorbar attribute. Notably, this condition also applies in the same way to transition frames representing a "fade in."

To promote efficiency, in at least one embodiment short-circuiting logic techniques are employed when testing the above-described conditions. As such, if one condition is not satisfied, the remaining conditions are not tested and the frame is identified as having a non-colorbar attribute. Accordingly, in one embodiment the four conditions (i.e., the pre-condition and the first, second, and third conditions) are tested in the order recited, although notably such an order is not required. At step 316, an indication of the associated colorbar/non-colorbar attribute is stored in a memory (e.g., in the computer-readable medium 212), among other things, for later retrieval and use by other applications. As such, if the frame is identified as having a colorbar attribute, an indication of a colorbar attribute is stored; but if the frame is identified as having a non-colorbar attribute, an indication of a non-colorbar attribute is stored.

Notably, in some embodiments, a second region may also be defined for the purpose of analyzing particular characteristics of the second row 406 or third row 408 of the frame 400. An example of a second region 410 is shown in FIG. 4 (not drawn strictly to scale). While the second region 410 optionally includes the entire current frame 400, in one embodiment, the second region defines a portion of a lower half of the current frame. In one embodiment, the second region 410 is a generally rectangular-shaped portion of the current frame 400 and is defined by a left-bound column, a right-bound column, a top-bound row, and a bottom-bound row. For a current frame 400 having a resolution of approximately 1920×1080, in one embodiment, the left-bound column is a value in a range 10-50, the right-bound column is a value in a range 1870-1910, the top-bound row is a value in a range 50-100, and the bottom-bound row is a value in a range 10-20, and in a particular embodiment, the values are 15, 1880, 70, and 10, respectively (thereby defining a second region 410 having a resolution of approximately 1865×60).

In some embodiments, each of the described steps associated with the region 400 are applied to the second region 410; in other embodiments, however, one or more additional steps and/or one or more substitute steps may be included, perhaps to specifically address one or more characteristics of the second row 406 or the third row 408, as examples.

For example, when defining the second region 410, the current frame could be identified as having a colorbar attribute some number—perhaps one or two—additional conditions are satisfied. A first such additional condition could be that the second region 410 is deemed mostly gray, meaning that a combined total of gray lumas represent a gray luma percentage of the region 410 that is greater than a gray luma percentage threshold for the region 410. A gray luma is defined as a luma having a value that is less than a gray luma threshold, which in at least one embodiment is a value in a range 44-52, and in a particular embodiment is 48. The gray luma percentage threshold could be a value in a range 3.0%-7.0%, and in a particular embodiment is approximately 5.0%

A second such additional condition could be that a second significant luma percentage (calculated for the second region in substantially the manner described above in connection with the first region) is greater than a second significant luma percentage threshold, which in at least one embodiment is a value in a range 60%-80%, and in a particular embodiment is approximately 70%.

In at least one embodiment, the steps of the present method are performed on each frame of baseband video in real time or near real time as that frame is received via the video input connection 208. Such a configuration provides for performing the above-described steps while contemporaneously processing each frame to create an encoded file representing the video. Notably, when processing frames in real time or near real time (e.g., through use of a frame buffer), there is an inherent limitation in that above-described steps applied to a current frame must be performed during an execution time period that is less than a reciprocal of the frame rate of the video (e.g., the steps of the present method must be performed within 1/29.97 seconds for video having a frame rate of 29.97 frames per second). Such time constraints present considerable challenges, particularly when the video is being transferred at a high data rate as the amount of data and the complexity of the calculations carried out by the processor 214 increase. However, due at least in part to the various optimization techniques as described throughout this disclosure, the steps of the present method are capable of being performed within limited time constraints and/or with a reduced use of system resources.

Notably, a frame-attribute table (or other data structure such as a linked list) may be used to store the indication of the associated colorbar/non-colorbar attribute in a memory as described above. As such, in one embodiment, a table may store such indications for all frames of a video package. Further, a separate frame-transition table may also be generated that indicates attribute changes or transitions between frames (e.g. the transition from a frame A having a colorbar attribute to a frame B having a non-colorbar attribute may be indicated as a from-colorbar transition).

As one example of the efficiency of the present method, testing shows that the steps of the present method are capable of being performed contemporaneously while processing each frame of video that is based on the HD-SDI standard (i.e., having a transfer rate of approximately 1.485 Gbps and a frame rate of 29.97 frames per second) using a quad-core processor, with each core having a speed of 2 GHz (e.g., a Xeon E5405 processor made by Intel® of Santa Clara, Calif.).

One particularly beneficial application of the present systems and methods is for use in conjunction with systems and methods for electronically tagging a VC in a video package as described in the cross-referenced U.S. patent application Ser. No. 13/629,497. As discussed therein, the ability to identify a colorbar/non-colorbar frame attribute with minimal processing power is particularly advantageous as some embodiments of the disclosed systems and methods for electronically tagging a VC in a video package rely not only on the identification of colorbar/non-colorbar frame attributes, but also on the identification of several other frame attributes that, even when combined, are restricted by (and carried out within) the frame-rate time constraints described above.

In some embodiments, video may also be obtained by decompressing and/or decoding an encoded file such as may be stored on the computer-readable medium 212, or stored on the source device 202, as but two examples. In some embodiments, the steps of the present method may be performed on each frame after baseband video is received via a video input connection 208 and processed and/or stored.

Although the presently disclosed systems and methods has been described in terms of select embodiments, alterations and permutations of these embodiments will be apparent to those skilled in the art. Accordingly, the above description of example embodiments does not define or constrain the presently disclosed systems and methods.

In particular, it is noted that while some specific embodiments have been described using particular applied algorithms, the presently disclosed systems and methods should not be construed as being limited to those particular implementations. For example, descriptions of iterative techniques can be implemented using recursive techniques, and vice-versa. Further, serial and parallel implementations can be interchanged. Similarly, it is contemplated that the use of logical structures including loops and condition statements can be modified, interchanged, or restricted without departing from the present systems and methods. Finally, it is contemplated that alternative data structure and storage techniques may be employed in implementing the techniques employed in connection with the present systems and methods (e.g., data stored in a table may instead be stored in a linked list, tree, or other data structure). Other changes, substitutions, and alterations are also possible without departing from the present systems and methods in its broader aspects as set forth in the following claims.

The invention claimed is:

1. A non-transitory computer-readable medium containing instructions that, when executed by a processor, cause a set of steps to be carried out for identifying a colorbar/non-colorbar attribute of a current frame, said set of steps comprising:
   receiving the current frame;
   defining a region of the current frame, the defined region having a plurality of lumas within a luma range;
   for each luma in said luma range, calculating a luma percentage of said region;
   calculating a significant luma percentage counter based on said luma percentages and a qualifying luma percentage threshold;
   calculating a significant luma percentage of said region, based on said luma percentages and said qualifying luma percentage threshold;
   determining a max-luma of said region based on said lumas; and
   identifying the current frame as having a colorbar attribute responsive to every condition in a condition set being satisfied, the condition set comprising at least first, second, and third conditions, said first condition being that said significant luma percentage counter is within a significant luma percentage counter range, said second condition being that said significant luma percentage is greater than a significant luma percentage threshold, and said third condition being that said max-luma is greater than a fade luma threshold; and
   storing an indication of an associated color-bar/non-colorbar frame attribute in a memory.

2. The computer-readable medium of claim 1, said set of steps further comprising:
   generating a luma table having a luma counter for each luma in said luma range based on said region; and
   for each said luma percentage greater than said qualifying luma percentage threshold, adding a corresponding luma counter to a significant luma counter,
   wherein said significant luma percentage is calculated based on said significant luma counter and a total luma count of said region.

3. The computer-readable medium of claim 2, wherein said luma table is stored in a register memory included on the processor.

4. The computer-readable medium of claim 1, wherein said computer-readable medium is included in a frame-processing device having a video input connection and configured to receive baseband video having a plurality of frames via said video input connection.

5. The computer-readable medium of claim 4, wherein said computer-readable medium is configured for contemporaneously processing each frame and performing said set of steps for each frame, and wherein performance of said set of steps for each frame occurs during an execution time period less that is than a reciprocal of a frame rate of the video.

6. The computer-readable medium of claim 5, wherein the video is received at a transfer rate having a value of 1.485 Gbps, and said execution time period is less than or equal to 1/29.97 seconds.

7. The computer-readable medium of claim 1, wherein said region is a generally rectangular-shaped portion of the current frame and is defined by a left-bound column, a right-bound column, a top-bound row, and a bottom-bound row.

8. The computer-readable medium of claim 7, wherein the current frame includes a row count of 1080 and a column count of 1920, both defining a resolution of the current frame, and wherein said left-bound column is a value in a range 10-50, said right-bound column is a value in a range 1870-1910, said top-bound row is a value in a range 10-40, and said bottom-bound row is a value in a range 50-250.

9. The computer-readable medium of claim 1, wherein said luma range is 0-255 and said fade luma threshold is a value in a range 118-138.

10. The computer-readable medium of claim 1, wherein said fade luma threshold is scaled proportionally according to said luma range.

11. The computer-readable medium of claim 1, wherein said qualifying luma percentage threshold is a value in a range 3.0%-7.0%, said significant luma percentage counter range is 3-13, and said significant luma percentage threshold is a value in a range 70%-80%.

12. The computer-readable medium of claim 1, wherein in said identifying step, the current frame is identified as having a non-colorbar attribute if the current frame is not identified as having a colorbar attribute.

13. The computer-readable medium of claim 1, wherein the first, second, and third conditions recited in said identifying step are configured to be tested in the order recited, and are further configured to employ a short-circuiting logic technique.

14. The computer-readable medium of claim 1, wherein said region is defined within an upper half of the current frame, said set of steps further comprising:
defining a second region within a lower half of the current frame, the second defined region having a plurality of second lumas within a second luma range, wherein
said condition set comprises fourth and fifth conditions, said fourth condition being that a combined total of second lumas in said second luma range indicates that a gray luma percentage of the second region is greater than a gray luma percentage threshold, and said fifth condition being that a second significant luma percentage is greater than a second significant luma percentage threshold.

15. The computer-readable medium of claim 1, wherein said condition set comprises a pre-condition, said pre-condition being that the current frame has a non-black attribute.

16. A frame-processing device, comprising:
a processor;
a non-transitory computer-readable medium containing instructions that, when executed by said processor, cause a set of steps to be carried out for identifying a colorbar/non-colorbar attribute of a current frame, said set of steps comprising:
receiving the current frame;
defining a region of the current frame, the defined region having a plurality of lumas within a luma range;
for each luma in said luma range, calculating a luma percentage of said region;
calculating a significant luma percentage counter based on said luma percentages and a qualifying luma percentage threshold;
calculating a significant luma percentage of said region, based on said luma percentages and said qualifying luma percentage threshold;
determining a max-luma of said region based on said lumas; and
identifying the current frame as having a colorbar attribute responsive to every condition in a condition set being satisfied, the condition set comprising at least first, second, and third conditions, said first condition being that said significant luma percentage counter is within a significant luma percentage counter range, said second condition being that said significant luma percentage is greater than a significant luma percentage threshold, and said third condition being that said max-luma is greater than a fade luma threshold; and
storing an indication of an associated color-bar/non-colorbar frame attribute in a memory.

17. The frame-processing device of claim 16, said set of steps further comprising:
generating a luma table having a luma counter for each luma in said luma range based on said region;
storing said luma table in a memory;
for each said luma percentage greater than said qualifying luma percentage threshold, adding a corresponding luma counter to a significant luma counter,
wherein said significant luma percentage is calculated based on said significant luma counter and a total luma count of said region.

18. The frame-processing device of claim 17, further comprising a video input connection, wherein said frame-processing device is configured to receive baseband video having a plurality of frames via said video input connection, wherein said computer-readable medium is configured for contemporaneously processing each frame and performing said set of steps for each frame, and wherein performance of said set of steps for each frame occurs during an execution time period less that is than a reciprocal of a frame rate of the video.

19. The frame-processing device of claim 16, wherein said region is a generally rectangular-shaped portion of the current frame, wherein said region is defined by a left-bound column, a right-bound column, a top-bound row, and a bottom-bound row, wherein the current frame includes a row count of 1080 and a column count of 1920, both defining a resolution of the current frame, and wherein said left-bound column is a value in a range 10-50, said right-bound column is a value in a range 1870-1910, said top-bound row is a value in a range 10-40, and said bottom-bound row is a value in a range 200-250.

20. A method for identifying a colorbar/non-colorbar attribute of a current frame, the method comprising the steps of:
receiving the current frame from a source device;
defining a region of the current frame, the defined region having a plurality of lumas within a luma range;
for each luma in said luma range, calculating a luma percentage of said region;
calculating a significant luma percentage counter based on said luma percentages and a qualifying luma percentage threshold;
calculating a significant luma percentage of said region, based on said luma percentages and said qualifying luma percentage threshold;
determining a max-luma of said region;
identifying the current frame as having a colorbar attribute responsive to every condition in a condition set being satisfied, the condition set comprising at least first, second, and third conditions, said first condition being that said significant luma percentage counter is within a significant luma percentage counter range, said second condition being that said significant luma percentage is greater than a significant luma percentage threshold, and said third condition being that said max-luma is greater than a fade luma threshold; and storing an indication of an associated color-bar/non-color-bar frame attribute in a memory.

\* \* \* \* \*